United States Patent
Lai

(10) Patent No.: US 10,211,290 B2
(45) Date of Patent: Feb. 19, 2019

(54) ELECTROSTATIC DISCHARGE PROTECTION

(71) Applicant: NXP B.V., Eindhoven (NL)

(72) Inventor: Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 376 days.

(21) Appl. No.: 15/066,086

(22) Filed: Mar. 10, 2016

(65) Prior Publication Data

US 2017/0263599 A1    Sep. 14, 2017

(51) Int. Cl.
*H01L 27/02* (2006.01)
*H01L 27/10* (2006.01)
*H01L 29/08* (2006.01)
*H01L 29/10* (2006.01)

(52) U.S. Cl.
CPC ........ *H01L 29/1079* (2013.01); *H01L 27/027* (2013.01); *H01L 29/0804* (2013.01); *H01L 29/0821* (2013.01); *H01L 29/0847* (2013.01); *H01L 29/1004* (2013.01)

(58) Field of Classification Search
CPC ............. H01L 27/0259; H01L 29/0804; H01L 29/0821; H01L 29/0847; H01L 29/1004; H01L 29/1079; H01L 20/1004; H01L 27/027
See application file for complete search history.

(56) References Cited

U.S. PATENT DOCUMENTS

| | | | |
|---|---|---|---|
| D224,882 S | 10/1972 | Alpern | |
| 6,750,517 B1 * | 6/2004 | Ker | H01L 23/585 257/355 |
| 7,098,513 B2 | 8/2006 | Chatty et al. | |
| 7,268,398 B1 | 9/2007 | Vashchenko et al. | |
| 2002/0149059 A1 * | 10/2002 | Ker | H01L 27/0277 257/355 |
| 2005/0224882 A1 | 10/2005 | Chatty et al. | |
| 2010/0013016 A1 * | 1/2010 | Shih | H01L 27/0259 257/360 |
| 2015/0008529 A1 * | 1/2015 | Wen | H01L 27/0277 257/369 |
| 2015/0194420 A1 * | 7/2015 | Wang | H01L 27/0262 257/133 |

OTHER PUBLICATIONS

Ming-Dou Ker et al., "ESD Implantations for On-Chip ESD Protection with Layout Consideration in 0.18-um Salidided CMOS Technology", IEEE Transactions on Semiconductor Manugacturing, vol. 18, No. 2, May 2005.
Ker, Ming-Dou, et al. "Impact of layout pickups to ESD robustness of MOS transistors in sub 100-nm CMOS process." Next-Generation Electronics (ISNE), 2010 International Symposium on. IEEE, 2010.

* cited by examiner

Primary Examiner — Zeev V Kitov

(57) ABSTRACT

A bipolar junction transistor is configured to provide electrostatic discharge (ESD) protection for an integrated circuit. The bipolar junction transistor includes a substrate configured to function as a gate for the bipolar junction transistor. At least one drain finger extends in a first direction on a first surface of the substrate and is configured to function as a collector for the bipolar junction transistor. At least one source finger extends in the first direction on the first surface of the substrate and is configured to function as an emitter for the bipolar junction transistor. The at least one source finger includes a pickup region that is configured to set a substrate potential.

20 Claims, 7 Drawing Sheets

ELECTROSTATIC DISCHARGE PROTECTION

OVERVIEW

Aspects of various embodiments are directed to providing protection for electrostatic discharge (ESD) events.

Electrostatic discharge (ESD) is the sudden flow of electricity that can be caused by a buildup of static electricity between two devices that come into electrical contact. An ESD event can occur when the objects are close enough for the dielectric between them to break down. ESD events are the cause of many failures for integrated circuit (IC) devices and chips. ESD protection can be provided using a variety of different circuit solutions. The operating characteristics for ESD protection can be limited by the IC chip space, manufacturing process and costs, and technology limitations.

These and other matters have presented challenges to efficiencies of ESD protection implementations, for a variety of applications.

SUMMARY

Various example embodiments are directed to issues such as those addressed above and/or others which may become apparent from the following disclosure concerning ESD protection devices that use pickup regions that are integrated into source regions of the devices.

In certain example embodiments, aspects of the present disclosure involve ESD protection devices that provide one or more of low holding voltages, a small footprint, high breakdown/failure current, symmetry in turn-on time and associated thresholds between multiple fingers, as well as other characteristics.

In certain embodiments, an apparatus includes a bipolar junction transistor that is configured to provide electrostatic discharge (ESD) protection for an integrated circuit. The bipolar transistor includes a substrate that is configured to function as a base for the bipolar transistor. At least one drain finger extends in a first direction on a first surface of the substrate and is configured to function as a collector for the bipolar transistor. At least one source finger extends in the first direction on the first surface of the substrate and is configured to function as an emitter for the bipolar transistor. The at least one source finger includes a pickup region that is configured to set a substrate potential.

In some embodiments, pickup regions are integrated into a source finger of a N-metal-oxide semiconductor (NMOS) transistor. The pickup regions are designed to provide a highly effective substrate resistance between drain fingers, which serve as collectors of a parasitic bipolar transistor in the CMOS transistor, and the pickup regions.

Various embodiments are directed toward a method for providing electrostatic discharge (ESD) protection for an integrated circuit. The method includes receiving voltage from an ESD event at least one drain finger of a gate grounded CMOS transistor, the at least one drain finger extending in a first direction on a first surface of a substrate; generating, in response to the voltage from the ESD event, current in the substrate; directing, by setting a substrate potential, the current in the substrate to a pickup region located within at least one source finger that extends in the first direction on the first surface of the substrate; enabling, in response to the current in the substrate, a parasitic bipolar transistor of the gate grounded CMOS transistor; and shunting current generated from the ESD event through the enabled parasitic bipolar transistor.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
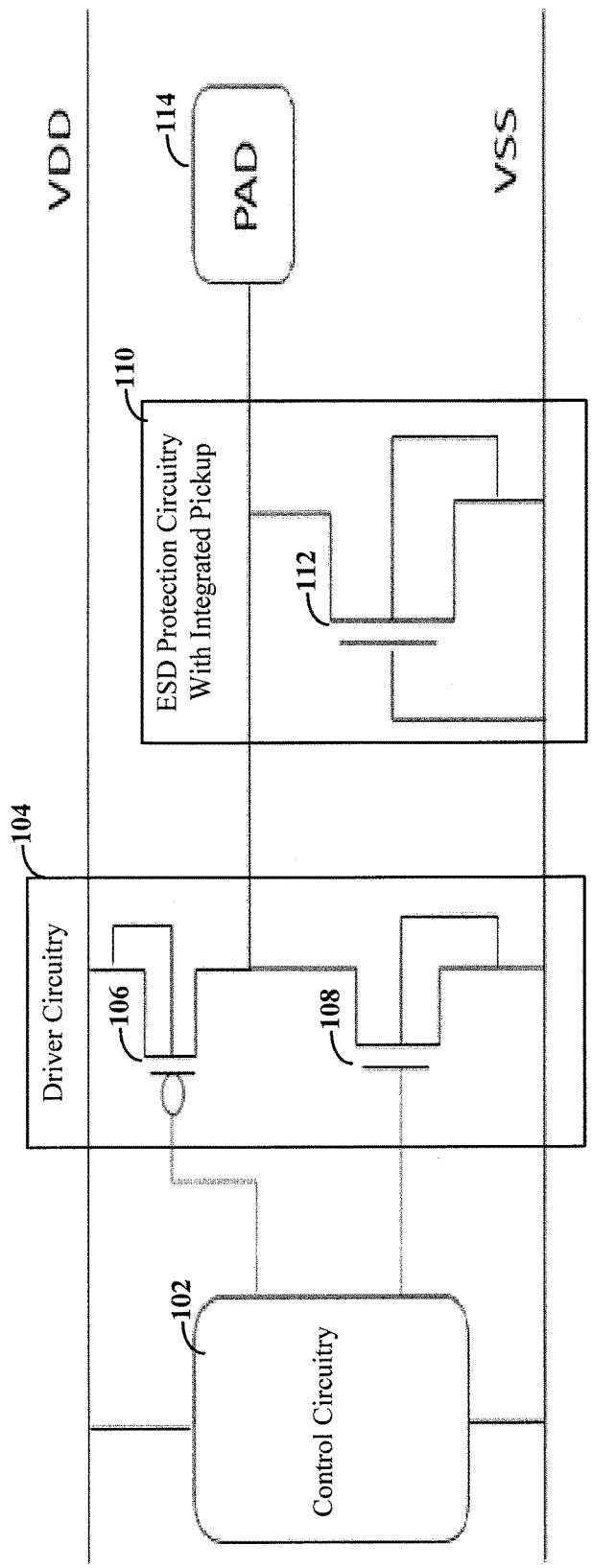
FIG. 1 depicts a circuit diagram for a system that includes ESD protection circuitry, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving electrostatic discharge (ESD) protection. In certain implementations, aspects of the present disclosure have been shown to be beneficial when used in the context of ESD protection in integrated circuit chips that use CMOS processes. In some embodiments, a bipolar transistor provides ESD protection using a pickup region within a source finger. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures or embodiments, it will be appreciated that features from one figure can be combined with features of another figure or embodiment even though the combination is not explicitly shown or explicitly described as a combination.

Various embodiments of the present disclosure are directed toward providing ESD protection for various circuit components. In some instances, the ESD protection can be provided using an ESD protection circuit that includes one or more bipolar transistors. The ESD protection circuit can be configured to shunt current generated by an ESD event, where an ESD event represents the introduction and receipt of voltage that is sufficient to harm the circuit being protected. Particular embodiments are directed toward an ESD protection circuit that includes a bipolar transistor that is configured to shunt the ESD current when the ESD pulse exceeds the trigger voltage of the ESD protection circuit. The trigger voltage corresponds to an avalanche breakdown condition in the circuit components of the ESD protection circuit. The shunting can continue until the voltage and current provided by the ESD pulse drop below the respective snapback holding current and snapback holding voltage for the ESD protection circuit.

According to various embodiments, the bipolar transistors can be created in connection with complementary metal-oxide semiconductor (CMOS) manufacturing processes and structures, where the bipolar transistors are formed from components alternate doping types (NPN or PNP) within the CMOS structures.

Consistent with certain embodiments, an ESD protection device includes one or more grounded-gate (gg) NMOS transistors where the NMOS gate, source, and body are each connected to ground. A parasitic bipolar transistor within the gg-NMOS transistor is configured to shunt the ESD current. The gg-NMOS transistor includes one or more pickup regions that are located within a source region of the gg-NMOS transistor. The pickup regions are doped with a P-type dopant to create a first type of carrier (holes). In particular implementations, the source region includes multiple fingers that alternate with drain regions. Each finger is doped with an N-type dopant to create a second type of carrier (electrons). A gate region separates the source and drain regions. The parasitic bipolar transistor is formed with the source region acting as an emitter and the drain region acting as a collector. The substrate, doped with a P-type dopant, functions as the base of the NPN parasitic bipolar transistor and the pickup regions set a potential for the substrate. When an ESD event occurs, a trigger current caused by an ESD event flows through the substrate to the pickup regions. The voltage created by the trigger current is defined by the substrate resistance between the pickup regions and the base region of the parasitic NPN bipolar transistor, which is located between the source and drain regions. Accordingly, the substrate resistance sets the (snapback) holding voltage of the parasitic bipolar transistor.

Various embodiments are directed toward an ESD protection device that includes one or more PMOS transistors that have a parasitic bipolar transistor. The parasitic bipolar transistor can be configured to shunt ESD current to provide the ESD protection. In this context, it is recognized that the various discussions of NMOS transistors and related structures can be implemented as PMOS. For ease of discussion and the sake of brevity, the complementary implementation using PMOS transistors and corresponding structures is not expressly discussed for each embodiment that uses NMOS devices.

Turning now to the figures, FIG. 1 depicts a circuit diagram for a system that includes ESD protection circuitry, consistent with embodiments of the present disclosure. Consistent with various embodiments discussed herein, the ESD protection circuitry 110 can be configured to provide ESD protection for components of the overall system of FIG. 1. In particular embodiments, the ESD protection circuitry can be configured to include pickup regions that are integrated with source regions of a transistor 112.

The system can include control circuitry 102 that is linked to driver circuitry 104. Driver circuitry 104 can be configured to drive a node 114, which can correspond to a connection pad (or just pad) that is exposed to potential sources of ESD events, which can be caused by electrical contact with a person or from other ESD sources. The control circuitry 102 can be configured for a wide variety of different functions and can include, as non-limiting examples, (micro) processor circuits with corresponding memory circuits, programmable logic, discrete logic components, and combinations thereof. According to various embodiments, the control circuitry 102 and the driver circuitry 104 can be located on a common substrate (e.g., as part of an IC chip) and pad 114 can be electrically connected to an externally accessible pad or pin.

According to various embodiments, the driver circuit 104 can include one or more transistors that can be damaged by ESD events. The particular configuration shows a push-pull type configuration that includes the two MOS transistors 106 and 108; however, various other types of driver circuitry can be protected. Moreover, driver circuitry 104 is provided as a particular example and is not meant to limit the ESD protection circuit to provide protection for just driver circuitry. Other types of circuitry can also be protected in a similar manner.

Transistor 112 is depicted as an NMOS transistor with the source, body and gate each being connected to ground (VSS). This configuration is sometimes referred to as a grounded-gate (gg) NMOS configuration. Tying the gate and source to the same voltage can keep the transistor 112 from conducting during normal operation. During normal operation, the driver circuitry 104 can drive the voltage on pad 114 to values within the voltage range defined by VDD and VSS. Transistor 112 is configured with breakdown characteristics that allow ESD current to be shunted through a parasitic bipolar transistor formed within the NMOS structure of the NMOS transistor. For ease of discussion, the terms emitter and collector are used when referring to the operation and configuration of the parasitic bipolar transistor. Similarly, the terms source and drain are used when referring to the NMOS transistor structure, where the source corresponds to the emitter and the drain corresponds to the collector.

Consistent with various embodiments, properties of the parasitic bipolar transistor can be controlled by use of one or more pickup regions. The pickup regions can set a voltage potential for the substrate, which forms the base of the parasitic bipolar transistor. For instance, the voltage potential can be set to keep the bipolar transistor disabled (e.g., tied to ground) under normal conditions. The ESD protection circuit can begin to turn on due to part of the impact ionization current in the collector of the parasitic bipolar transistor reaching the substrate of the device and leaving through a corresponding pickup region. In particular, the substrate resistance between the collector and the pickup region results in a voltage drop (potential difference between collector and pickup region) that creates a voltage at the base of the bipolar transistor. When the potential difference is large enough, the parasitic bipolar transistor will turn-on and shunt ESD current. The minimum voltage to maintain the parasitic bipolar transistor in the on state is sometimes referred to as the holding voltage. As discussed herein and consistent with the above discussion, the holding voltage can be a function of the effective substrate resistance between the collector and the pickup region.

According to certain embodiments, pickup regions are integrated into source regions of the NMOS transistor. In particular implementations, the integration of the pickup regions can allow for the reduction in the overall size of the NMOS transistor 112, relative to placement of pick up regions outside of the source regions (e.g., relative to using a guard ring that surrounds an otherwise equivalent NMOS transistor). In some implementations, and again relative to the placement of pick up regions outside of the source regions, the integration of the pickup regions can be designed to increase the effective substrate resistance for the parasitic bipolar transistor, and thereby reduce the holding voltage. For example, the pickup region can be designed to have a small size that results in a narrow path for current to enter the pickup region from the substrate. According to various embodiments, the reduced size and holding voltage that can result from integrated pickup regions can be achieved as part of a CMOS compatible process and without using additional masks or well-controlled processes. Such additional steps might otherwise be used when attempting to increase the holding voltage. For example, holding voltage might be increased by the use of an additional implant under the drain, a triple well layer, a Zener-like implant beneath the junction on the drain side, or an n-sinker type region. Each of these approaches can use additional processing steps that can add to the complexity and cost of the corresponding devices.

Figure 2:
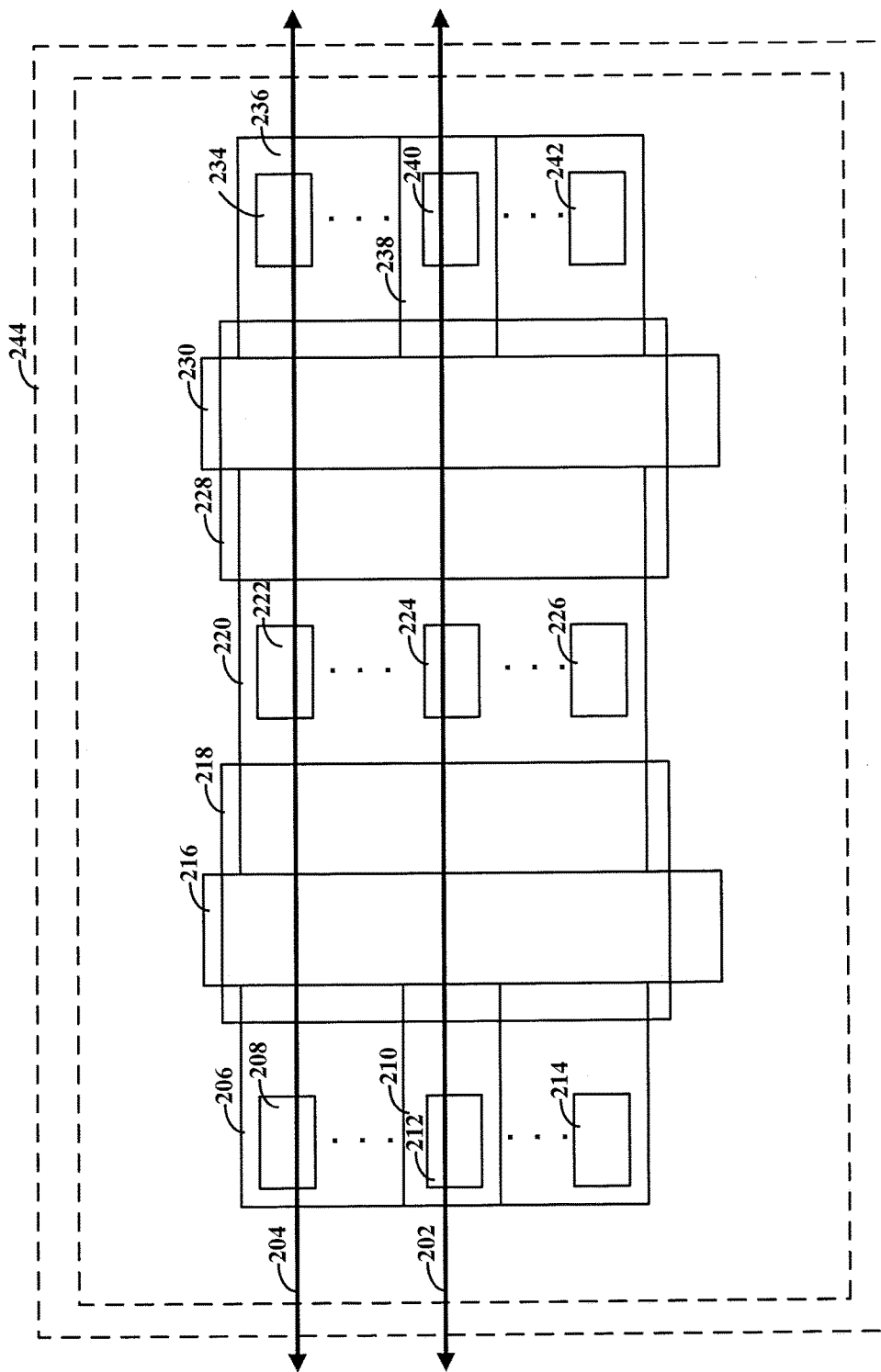
FIG. 2 depicts a top down view of a portion of a device that provides ESD protection using an integrated pickup region, consistent with embodiments of the present disclosure.

FIG. 2 depicts a top down view of a portion of a device that provides ESD protection using an integrated pickup region, consistent with embodiments of the present disclosure. The depicted components and regions are located on a semiconductor substrate that can be part of a larger integrated circuit (IC) device. The IC device can include one or more circuit elements that are protected from ESD events by the depicted components. Arrows 202 and 204 provide reference points for cross-sectional views provided in FIG. 3 and FIG. 4, respectively. The depicted components, although not necessarily limited thereto, can be used in connection with various other figures and embodiments discussed herein.

Consistent with various embodiments, ESD protection can be provided using a parasitic bipolar transistor resulting from a CMOS transistor structure that includes source regions 206 and 236, gate regions 216 and 230, and a drain region 220. As an example, the CMOS transistor structure of FIG. 2 can be connected in a manner that is consistent with the circuit diagram of FIG. 1. Although not expressly depicted, multiple additional source and drain regions (or "fingers") can be included as part of the CMOS transistor structure by repeating the alternating source, gate, and drain regions as depicted. A particular example of such embodiments is shown and discussed in connection with FIG. 5. According to certain embodiments, the CMOS transistor structure is located within a P-doped portion of a semiconductor substrate, or a P-well. The source and drain regions are each N-doped regions. In particular implementations, the source and drain regions can be heavily doped (N+) relative to the corresponding doping concentration of the substrate (P).

According to embodiments, contacts 208, 212, 214, 222, 224, 226, 234, 240, and 242 can provide a connection between the underlying regions and external wiring layers. For example, source contacts 208, 214, 234, and 242 can be connected to ground, consistent with the circuit diagram of FIG. 1. The drain contacts 222, 224, and 226 can be connected to a node that is to be protected from damaging ESD events (e.g., a node that is connected to external pad or pin that can come into electrical contact with a person or other source of ESD). An example, the contacts can be metal and might also include an underlying silicide layer. According to various embodiments, the gate regions 216 and 230 can include a conductive gate electrode with an insulator physically and electrically separating the electrode from the substrate.

Various embodiments include the use of a silicide blocked area 218 and 228 in which silicide diffusion is inhibited (blocked) in the corresponding portion of the drain and source regions. The result is an increased sheet resistance in the blocking areas, relative to silicide in the corresponding areas. This can be useful for controlling the ESD related properties of the device and its parasitic bipolar transistor (e.g., secondary breakdown current or the device failure point ($I_{t2}$) and turn on resistance ($R_{on}$)).

A guard/pickup ring 244 is depicted with dashed lines. The pickup ring 244 can be implemented as a heavily doped P-region (P+) that can provide a reference potential for the substrate. During an ESD event, the pickup ring 244 can provide a path for trigger current that is injected into the substrate. When there is a sufficient amount voltage build up and corresponding trigger current, the parasitic bipolar transistor can be turned on and ESD current can be shunted through the parasitic bipolar transistor. In certain implementations, the pickup ring 244 can be tied to ground. This pickup ring is indicated by dashed lines as it is not part of the depicted embodiments. The pickup ring 244, however, provides a reference point for discussion. For example, the pickup regions 210 and 238 can be used instead of a pickup ring 244. As such, the pickup ring 244 can be useful discussing properties of ESD devices with the guard ring 244 relative to the same properties of ESD devices without the guard ring 244.

According to embodiments of the present disclosure, the pickup regions 210 and 238 can be integrated into the source regions 206 and 236, respectively. The pickup regions 210 and 238 can be implemented as a heavily doped P-regions (P+) that can provide a reference potential to the substrate in a manner that is similar to the pickup ring 244. The use of integrated pickup regions 210 and 238 allows for the substrate potential to be set without the extra area taken up by the guard ring 244. This allows for the ESD device to be implemented with less overall area. The substrate potential can be set using the contacts 212 and 240, which can be electrically connected to ground through a wiring layer of the IC device.

According to certain embodiments, the use of integrated pickup regions 210 and 238 provides a reduced holding voltage for the ESD device relative to a similar ESD device that uses a guard ring 244. The decreased holding voltage can be a byproduct of an increased effective substrate resistance between the collector of the bipolar transistor and the pickup region. The effective resistance is increased by using a relatively small pickup region 210, which results in a small cross-sectional area through which the trigger current passes. The resistance of a three-dimensional conductor is inversely related to the cross-sectional area. The use of integrated pickup regions 210 and 238 has been shown to reduce the holding voltage for CMOS structures that are consistent with the embodiments discussed herein (relative to using an external guide ring). It is noted that the calculation of the effective resistance can be a relatively complex computation that can rely upon: three-dimensional shapes of structures, doping profiles, and properties and location of other components in the system. Thus, variations in the CMOS structures can have an effect on the relative effective resistances of corresponding devices.

As discussed herein and consistent with certain embodiments, the holding voltage ($V_H$) and similar parameters can be determined using transmission line pulse (TLP) measurements. A TLP measurement can be taken by pre-charging a transmission line to a high-voltage and then rapidly discharging the energy to the ESD protection device being tested. Unless otherwise stated, relative comparisons of parameters for different devices (e.g., holding voltage or otherwise) are made using a similar TLP measurement process for each of the compared devices. The holding voltage, as measured via TLP measurements, is inversely related to the effective substrate resistance ($R_{sub}$), roughly speaking: $V_H=1/R_{sub}$.

Figure 3:
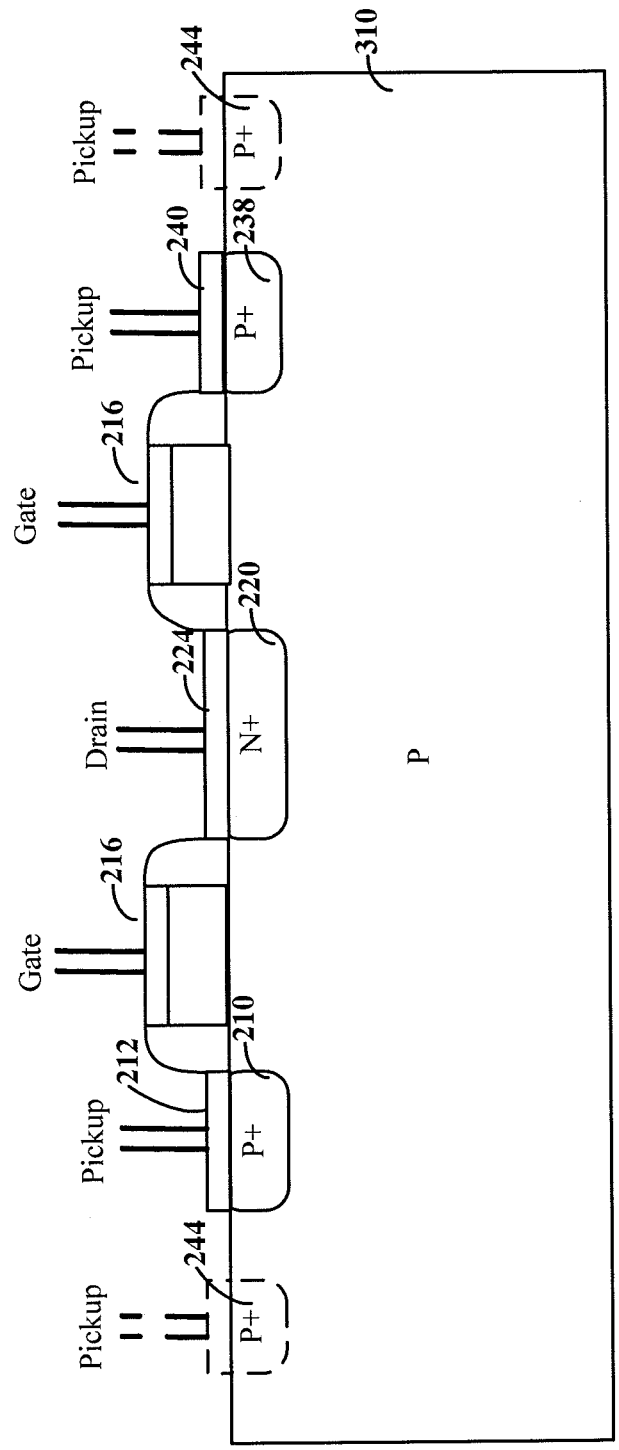
FIG. 3 depicts a cross-sectional view of a portion of a device that provides ESD protection using an integrated pickup region, consistent with embodiments of the present disclosure.

FIG. 3 depicts a cross-sectional view of a portion of a device that provides ESD protection using an integrated pickup region, consistent with embodiments of the present disclosure. The particular cross-sectional view of FIG. 3 corresponds to line 202 from FIG. 2 and includes the pickup regions 210 and 238. Guard ring 244 is again shown for reference purposes. For ease of discussion and sake of brevity, numbering for identical features is carried forward from FIG. 2 and the corresponding discussion is not repeated. As discussed in connection with various embodiments, the substrate 310 can be doped with a P-type dopant. This creates an NPN transistor between the drain region (N+) 220 and source regions (N+) 206 and 204 (not visible in FIG. 3 due to the presence of the pickup regions 210 and 238). The resulting PNP transistors are shown schematically in FIG. 4 as 306 and 308.

According to embodiments discussed herein, the drain contact 224 can be connected to the node being protected from the ESD events. When an ESD voltage is applied to the collector (drain 224), a trigger current in the substrate 310 begins flowing from the collector to the pickup regions 212 and 240. As discussed herein, the effective resistance through the substrate and along this current path can play a role in setting the holding voltage of the bipolar transistors 306 and 308. Various embodiments are directed toward designing the pickup regions 212 and 240 to increase the effective resistance relative to a current path that would exist between the collector and the pickup ring 244 (if the pickup ring 244 was used instead of pickup regions 212 and 240).

Figure 4:
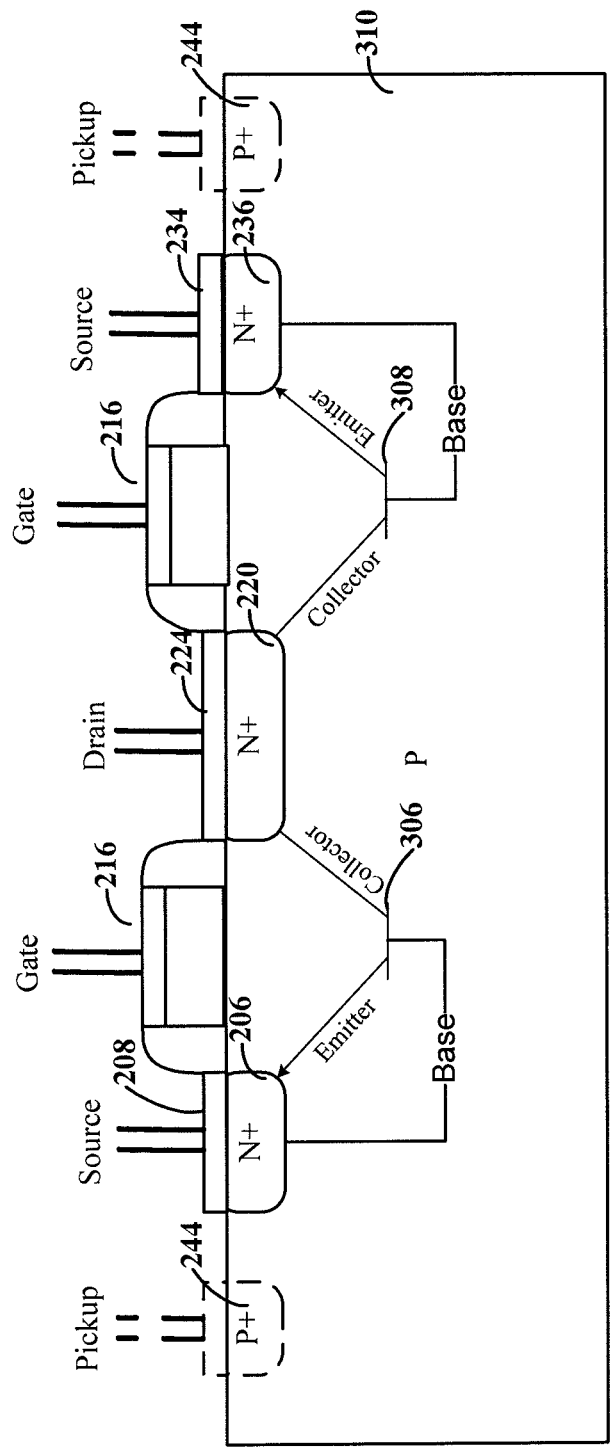
FIG. 4 depicts a cross-sectional view of a portion of a device that provides ESD protection using an integrated pickup region, consistent with embodiments of the present disclosure.

FIG. 4 depicts a cross-sectional view of a portion of a device that provides ESD protection using an integrated pickup region, consistent with embodiments of the present disclosure. The particular cross-sectional view of FIG. 3 corresponds to line 204 from FIG. 2 and includes source regions 206 and 236 as well as their corresponding contact regions 208 and 234. For ease of discussion and sake of brevity, numbering for identical features is carried forward from FIGS. 2 and 3 and the corresponding discussion is not repeated. The primary difference of FIG. 4 is that the source regions 206 and 236 are depicted. The bases of the parasitic bipolar transistors 306 and 308 would be connected to the pickup regions 210 and 238, which are not visible in this cross-section.

Figure 5:
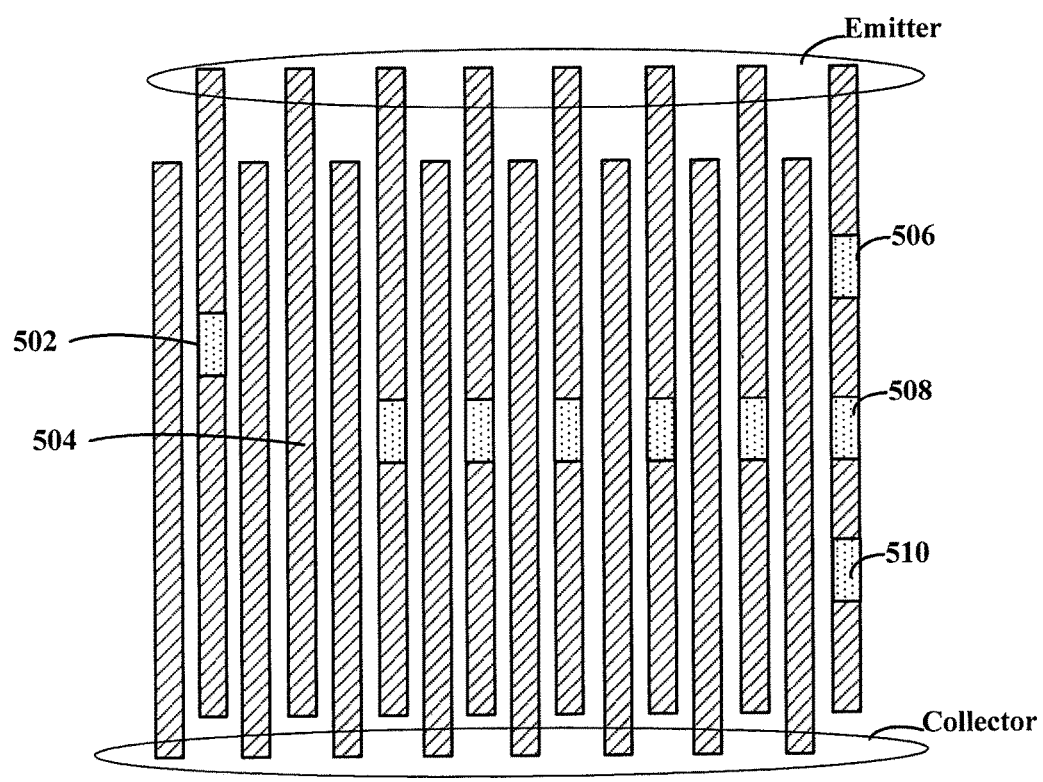
FIG. 5 shows a top down view of a layout for a multi-finger NMOS transistor, consistent with embodiments of the present disclosure.

FIG. 5 shows a top down view of a layout for a multi-finger NMOS transistor, consistent with embodiments of the present disclosure. As indicated by the diagonal line fill, FIG. 5 shows alternating emitter (source) and collector (drain) regions, which would be doped with N-type dopant. Pickup regions are integrated into the emitter (source) regions by introducing a P-type dopant into a portion of the fingers and are indicated by the dotted fill.

One consideration for the placement of the pickup regions is the uniformity of the effective substrate resistance for each parasitic bipolar transistor. Lack of uniformity can result in an asymmetric turn-on for the various bipolar transistors. Accordingly, consistent placement of pickup regions within each emitter finger can be useful for providing symmetric responses for each corresponding parasitic bipolar transistor.

According to various embodiments, the pickup regions can be integrated into less than all of the emitter fingers, as shown by the absence of a pickup region in emitter finger 504. For example, the pickup regions can be integrated into every other emitter finger, every third finger, or according to another distribution pattern. In some embodiments, the placement of the pickup regions can be offset from one another relative to the direction that the fingers extend, as indicated by the placement of pickup region 502 in comparison to the other pickup regions. According to some embodiments, multiple pickup regions can be placed into each of the fingers. For example, the number of pickup regions in each finger can be increased, as shown by the three pickup regions 506, 508, and 510. This can result in a lower effective resistance, which is useful for lower the holding voltage relative to the use of a single pickup region. Alternatively or in addition, the size of the pickup regions can be increased to achieve similar results (or decreased to achieve higher holding voltage).

It is noted that the particular layout and configurations in the preceding figures are not comprehensive of all possible variations and are meant to be illustrative of the general components of a particular CMOS transistor structure. The particular manufacturing process used is also not limited to a specific example. This can include various mature technologies or more advanced technologies such as CMOS040 (CMOS 40 nm technology). Various different products can also benefit from ESD protection, such as those related to radio frequency (RF) communication circuits (e.g., using silicon RF-BiCMOS technology such as QUBIC4 Si and SiGe, and high speed interfaces). BiCMOS is a semiconductor technology that allows for bipolar junction transistors with CMOS transistors to be manufactured within a single integrated circuit device.

Figure 6:
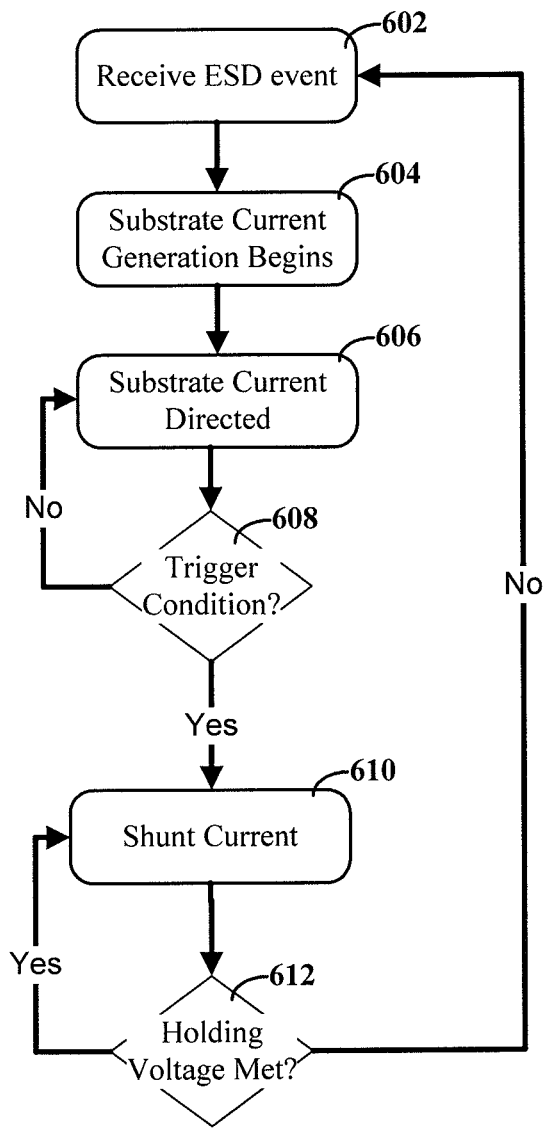
FIG. 6 depicts a flow diagram for manufacturing an ESD protection circuit, consistent with embodiments of the present disclosure.

FIG. 6 depicts a flow diagram for use of an ESD protection circuit, consistent with embodiments of the present disclosure. The flow begins when an ESD event is received by the ESD protection, per block 602. As an example, the source of the ESD voltage for the ESD event might be from when an object or person touches or comes in close proximity to an external electrical connection of an IC die. As discussed herein, this external electrical connection can be connected to drain fingers of a gate grounded CMOS transistor, where the drain corresponds to a collector of a parasitic bipolar transistor.

The ESD voltage creates a reverse bias between the collector and the substrate (which can form a PN junction). If the ESD voltage is sufficiently high, it can cause current to be generated in the substrate despite the reverse bias condition, per block 604. For example, the impact ionization current in the collector of the parasitic bipolar transistor can begin to reach the substrate.

According to various embodiments discussed herein, the substrate current can be directed to one or more pickup regions, per block 606. The pickup regions can be located within source fingers and configured to increase (relative to the use of a guard ring) the effective resistance for the directed current. As discussed herein, the pickup regions can be tied to ground in order to set the substrate potential and to receive the generated current. It is noted that the substrate potential does not have to set to be exactly ground, but the potential is discussed as being ground for simplicity. The ESD protection circuit current continues to direct current in this manner without turning on the parasitic bipolar transistor until an ESD trigger condition is reached, per block 608. For example, the ESD trigger condition can correspond to an ESD trigger voltage/current threshold being reached, where the threshold corresponds to avalanche breakdown occurring within the ESD protection circuit.

In response to the trigger condition has been satisfied, the ESD protection circuit beings shunting ESD current to protect the circuit components, per block 610. This corresponds to the parasitic bipolar transistor turning on so that the current is shunted between the collector and emitter. The ESD protection circuit will continue to shunt current in this manner until the holding voltage ceases to be met, per block 612. Once the ESD voltage goes below the holding voltage, the parasitic bipolar transistor turns off until the ESD protection circuit receives another ESD event.

Figure 7:
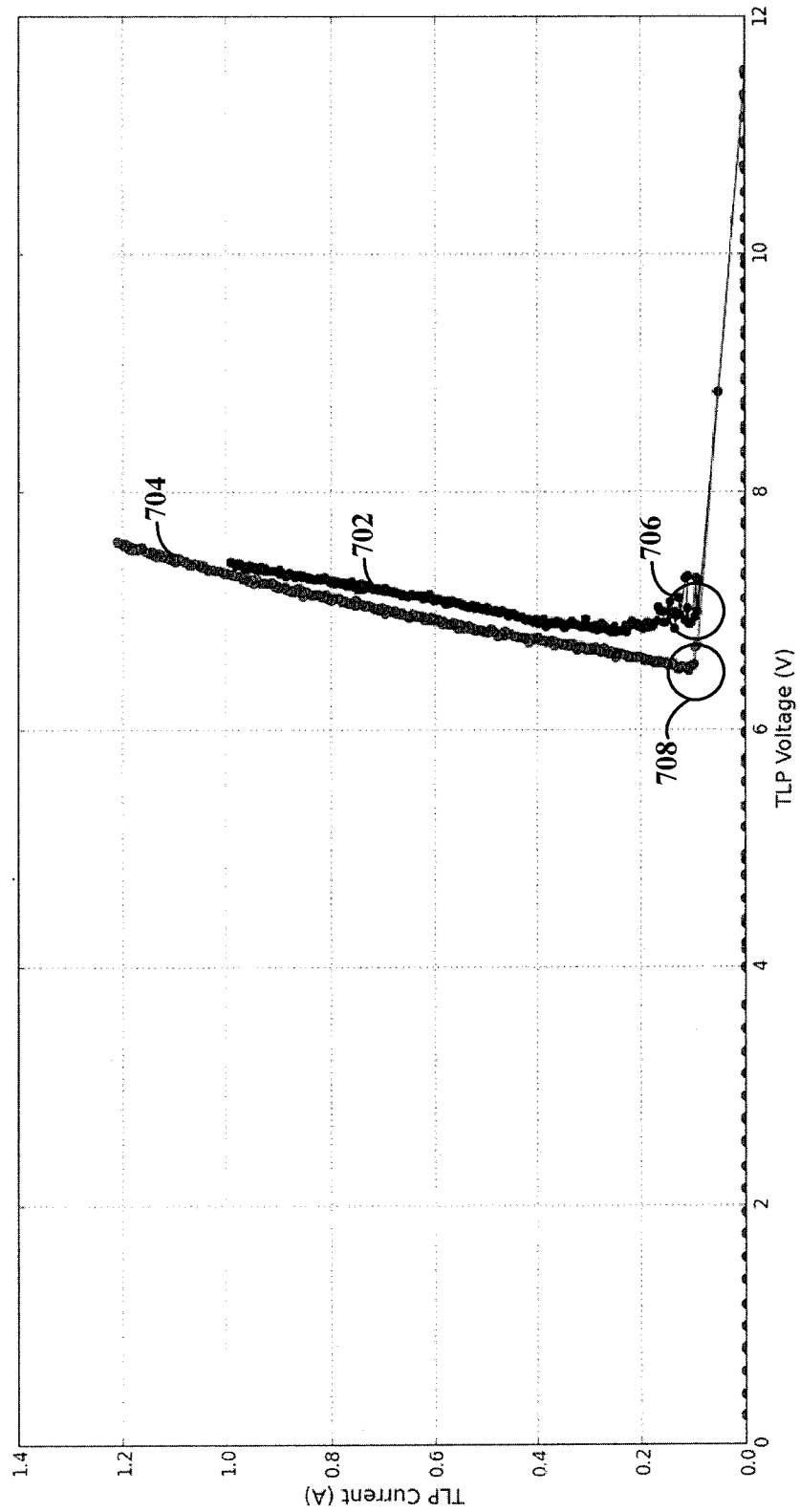
FIG. 7 depicts a graph of experimental transmission line pulse (TLP) test results, consistent with embodiments of the present disclosure.

FIG. 7 depicts a graph of experimental TLP test results, consistent with embodiments of the present disclosure. The graph shows plots for two ESD protection circuits that are similarly configured other than their respective use of either a pickup guard ring (plot 702) or pickup regions integrated into the source (emitter) regions (plot 704). Plot 704 shows a lower holding voltage 708 than the corresponding holding voltage 706 of plot 702. This illustrates the ability to lower the holding voltage by replacing the pickup guard ring with the integrated pickup regions.

The last point in each plot represents the device failure point for the respective device, also referred to as the secondary breakdown current ($I_{T2}$). Due in part to the lowered holding voltage, FIG. 7 demonstrates that the $I_{T2}$ is higher in plot 704. This is believed to be due to the reduction in power consumption caused by the lower TLP current and voltage.

Table 1 shows a similar comparison of relative properties of ESD devices relative to their use of a pickup ring vs. integrated pickup regions. The results show about 15% area reduction with a 20% increase in ESD performance for comparable devices.

TABLE 1

|  | Total Width (μm) | Cell Height (μm) | Cell Width (μm) | $I_{T2}$ (A) | $I_{T2}$/Area (mA/μm$^2$) |
| --- | --- | --- | --- | --- | --- |
| Guard | 240 | 34 | 21 | 1.0 | 1.4 |
| Integrated | 240 | 32 | 19 | 1.2 | 2.0 |

The skilled artisan would recognize that various terminology as used in the Specification (including claims) connote a plain meaning in the art unless otherwise indicated. As examples, the Specification describes and/or illustrates aspects useful for implementing the claimed invention by way of various circuits or circuitry which may be illustrated as or using terms such as blocks, modules, device, system, unit, controller, control circuitry and/or other circuit-type depictions (e.g., reference numeral 102 of FIG. 1 depicts a block as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits, programmable logic circuits configured and arranged for implementing these operations/activities, or combinations thereof. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process is used by the programmable circuit to perform various steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the invention, including aspects set forth in the claims.

What is claimed is:

1. An apparatus comprising:
a bipolar junction transistor that is configured to provide electrostatic discharge (ESD) protection for an integrated circuit, the bipolar junction transistor including:
a substrate configured to function as a base for the bipolar junction transistor;
one or more drain fingers extending in a first direction on a first surface of the substrate and configured to function as a collector for the bipolar junction transistor; and
one or more source fingers extending in the first direction on the first surface of the substrate and configured to function as an emitter for the bipolar junction transistor, the one or more source fingers including a first source finger that includes a pickup region that is formed within a portion of the first source finger, the pickup region configured to set a substrate potential.

2. The apparatus of claim 1, wherein the bipolar junction transistor is a parasitic bipolar junction transistor of a grounded-gate metal oxide semiconductor transistor.

3. The apparatus of claim 1, wherein the pickup region is configured to provide a reduced holding voltage, based on a substrate resistance between the collector and the pickup region.

4. The apparatus of claim 3, wherein the reduced holding voltage results in an increased secondary breakdown current for the bipolar junction transistor.

5. The apparatus of claim 1, wherein the one or more drain fingers and the one or more source fingers are doped with a first type of dopant that creates a first type of carrier and wherein the pickup region is doped with a second type of dopant that creates a second type of carrier that is opposite of the first type of carrier.

6. The apparatus of claim 5, wherein the first type of dopant is an N-type dopant and the second type of dopant is a P-type dopant.

7. The apparatus of claim 1, wherein the first source finger further includes a second pickup region that is configured to set the substrate potential.

8. The apparatus of claim 1, wherein each of the one or more source fingers includes a corresponding pickup region.

9. The apparatus of claim 8, wherein each source finger further includes a second pickup region spaced apart from the corresponding pickup region in the first direction.

10. A method for providing electrostatic discharge (ESD) protection for an integrated circuit, the method comprising:
receiving voltage from an ESD event at one or more drain fingers of a gate grounded CMOS transistor, the one or more drain fingers extending in a first direction on a first surface of a substrate;
generating, in response to the voltage from the ESD event, current in the substrate;
directing, by setting a substrate potential, the current in the substrate to a first pickup region that is formed within a first source finger that extends in the first direction on the first surface of the substrate;
enabling, in response to the current in the substrate, a parasitic bipolar transistor of the gate grounded CMOS transistor; and
shunting current generated from the ESD event through the enabled parasitic bipolar transistor.

11. The method of claim 10, wherein the substrate potential is ground.

12. The method of claim 10, wherein the one or more drain fingers and the first source finger are doped with a first type of dopant, and the first pickup region formed within the first source finger is doped with a second type of dopant, opposite the first type of dopant.

13. The method of claim 10, wherein the one or more drain fingers, the first source finger, and the substrate respectively correspond to a collector, an emitter, and a base of the parasitic bipolar transistor.

14. The method of claim 13, wherein the directing, by setting the substrate potential, the current in the substrate provides a reduced holding voltage, based on a substrate resistance between the collector and the first pickup region.

15. The method of claim 14, wherein the reduced holding voltage results in an increased secondary breakdown current for the bipolar junction transistor.

16. The method of claim 10, wherein the directing the current in the substrate to the first pickup region further includes directing the current in the substrate to another pickup region in a second source finger.

17. The method of claim 10, wherein the directing the current in the substrate to the first pickup region further includes directing the current in the substrate to a second pickup region within the first source finger.

18. The method of claim 17, wherein the second pickup region provides a reduced holding voltage, based on a lowered substrate resistance, relative to a first substrate resistance between the one or more drain fingers and the first pickup region.

19. The apparatus of claim 5, wherein the first type of dopant is introduced at least into a first area on the substrate that corresponds to the first source finger, and the second type of dopant is introduced into a portion within the first area that corresponds to the pickup region.

20. The apparatus of claim 3, wherein the pickup region has a small cross-sectional area relative to the collector.

* * * * *